(12) United States Patent
Shin et al.

(10) Patent No.: US 11,152,686 B2
(45) Date of Patent: Oct. 19, 2021

(54) ELECTRONIC DEVICE COMPRISING ANTENNA

(71) Applicant: Samsung Electronics Co., Ltd., Suwon-si (KR)

(72) Inventors: Dong Ryul Shin, Daegu (KR); Him Chan YuN, Suwon-si (KR); Yoon Jae Lee, Yongin-si (KR); Jung Hoon Seo, Hwaseong-si (KR); Ui Chul Jeong, Anyang-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 216 days.

(21) Appl. No.: 16/107,277

(22) Filed: Aug. 21, 2018

(65) Prior Publication Data
US 2019/0067795 A1    Feb. 28, 2019

(30) Foreign Application Priority Data

Aug. 23, 2017 (KR) .................. 10-2017-0106954

(51) Int. Cl.
*H01Q 1/24* (2006.01)
*H01Q 1/22* (2006.01)
(Continued)

(52) U.S. Cl.
CPC .......... *H01Q 1/2283* (2013.01); *H01Q 1/243* (2013.01); *H01Q 1/50* (2013.01); *H01Q 5/371* (2015.01);
(Continued)

(58) Field of Classification Search
CPC ...... H01Q 1/2283; H01Q 1/243; H01Q 5/371; H01Q 1/50; H01Q 9/0414; H01Q 1/36; H01Q 1/38; H01Q 1/48
See application file for complete search history.

(56) References Cited

U.S. PATENT DOCUMENTS 7,199,854 B2   4/2007  Yu
8,698,680 B2   4/2014  Gutschenritter et al.
(Continued)

FOREIGN PATENT DOCUMENTS

CN   102195121 A    9/2011
CN   103326124 A    9/2013
(Continued)

OTHER PUBLICATIONS

Chinese Office Action dated Jan. 6, 2020, issued in a counterpart Chinese Application No. 201810962713.4.
(Continued)

*Primary Examiner* — Dieu Hien T Duong
(74) *Attorney, Agent, or Firm* — Jefferson IP Law, LLP

(57) ABSTRACT

An electronic device which includes a housing is provided. The housing includes a first surface, a second surface facing away from the first surface, and a side member surrounding a space between the first surface and the second surface, a display that is exposed through a substantial portion of the first surface of the housing, a first radiator that forms a portion of the side member, a PCB that is positioned within the housing and includes a ground layer, a communication circuit that is positioned on the PCB, and a conductive pattern having a length corresponding to a length of the first radiator.

16 Claims, 16 Drawing Sheets

(51) Int. Cl.
*H01Q 5/371* (2015.01)
*H01Q 1/50* (2006.01)
*H01Q 9/04* (2006.01)
*H05K 1/02* (2006.01)
*H05K 1/18* (2006.01)

(52) U.S. Cl.
CPC .......... *H01Q 9/0414* (2013.01); *H05K 1/028* (2013.01); *H05K 1/181* (2013.01); *H05K 2201/093* (2013.01); *H05K 2201/10098* (2013.01); *H05K 2201/10128* (2013.01)

(56) References Cited

U.S. PATENT DOCUMENTS

| | | | |
|---|---|---|---|
| 9,425,509 | B2 | 8/2016 | Liou et al. |
| 9,585,252 | B2 | 2/2017 | Yeo et al. |
| 9,831,555 | B2 | 11/2017 | Sakurai |
| 9,859,608 | B2 | 1/2018 | Wang et al. |
| 9,893,426 | B2 | 2/2018 | Lapushin |
| 9,961,763 | B2 | 5/2018 | Yeo et al. |
| 10,205,225 | B2 | 2/2019 | Ha et al. |
| 10,224,606 | B2 | 3/2019 | Kim et al. |
| 10,553,931 | B2 | 2/2020 | Ha et al. |
| 10,819,010 | B2 | 10/2020 | Lee et al. |
| 2005/0083447 | A1 | 4/2005 | Yu |
| 2011/0222219 | A1 | 9/2011 | Bae et al. |
| 2013/0181873 | A1 | 7/2013 | Gutschenritter et al. |
| 2014/0198003 | A1 | 7/2014 | Sakurai |
| 2015/0002340 | A1 | 1/2015 | Liou et al. |
| 2016/0073498 | A1 | 3/2016 | Yeo et al. |
| 2016/0254588 | A1 | 9/2016 | Kim et al. |
| 2017/0012354 | A1 | 1/2017 | Wang et al. |
| 2017/0117620 | A1 | 4/2017 | Lapushin |
| 2017/0135201 | A1 | 5/2017 | Yeo et al. |
| 2017/0170562 | A1 | 6/2017 | Lee et al. |
| 2017/0301998 | A1* | 10/2017 | Desclos ............... H01Q 5/328 |
| 2018/0261921 | A1 | 9/2018 | Ha et al. |
| 2018/0309189 | A1* | 10/2018 | Gu ..................... H01Q 1/243 |

FOREIGN PATENT DOCUMENTS

| | | |
|---|---|---|
| CN | 204809377 U | 11/2015 |
| CN | 106410371 A | 2/2017 |
| KR | 10-2017-0071200 A | 6/2017 |
| WO | 2016/137301 A1 | 9/2016 |
| WO | 2017/090997 A1 | 6/2017 |
| WO | 2017090865 A | 6/2017 |

OTHER PUBLICATIONS

International Search Report dated Dec. 4, 2018, issued in International Application No. PCT/KR2018/009607.
European Search Report dated Jan. 7, 2019, issued in European Application No. 18190495.4-1205.
Korean Office Action with English translation dated May 10, 2021; Korean Appln. No. 10-2017-0106954.
Chinese Notice of Allowance dated Jun. 3, 2021; Chinese Appln. No. 201810962713.4.

* cited by examiner

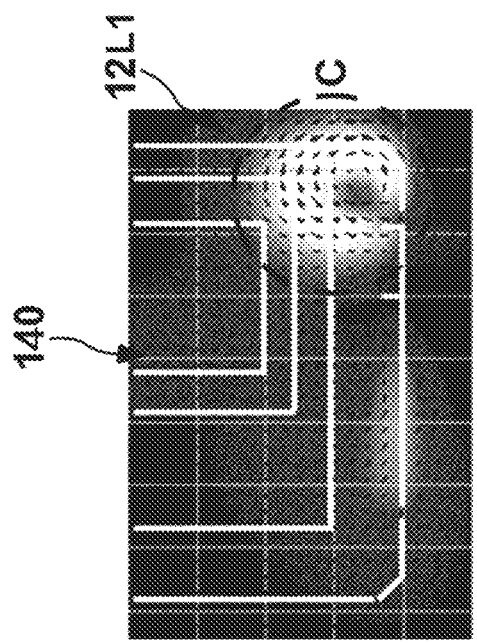
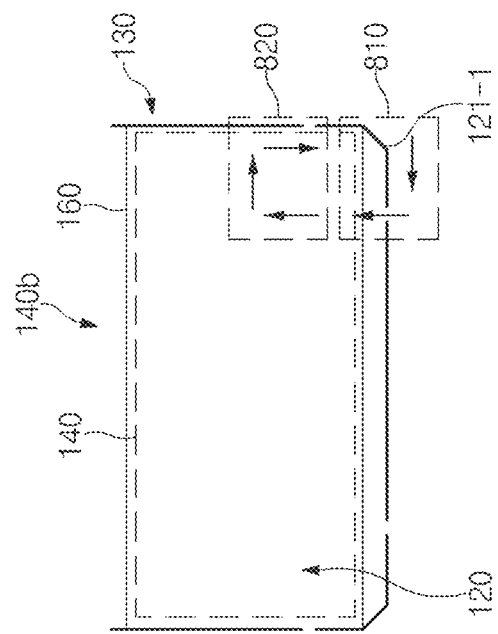
FIG. 8B
FIG. 8A

ELECTRONIC DEVICE COMPRISING ANTENNA

CROSS-REFERENCE TO RELATED APPLICATION(S)

This application is based on and claims priority under 35 U.S.C. § 119 of a Korean patent application number 10-2017-0106954, filed on Aug. 23, 2017, in the Korean Intellectual Property Office, the disclosure of which is incorporated by reference herein its entirety.

BACKGROUND

1. Field

The disclosure relates to an antenna included in an electronic device.

2. Description of Related Art

An electronic device, which is equipped with a display, such as a smartphone, a wearable device, or the like has been widely supplied as mobile communication technologies develop. The electronic device may execute various functions such as a photo or video capturing function, a music or video file play function, a game function, an Internet function, and the like through the display.

In the case where the size of the display is small, it may be inconvenient to execute the above functions. As such, nowadays, a technology for maximally expanding the size of the display is being developed. For example, a technology associated with a full front display is being developed.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an electronic device which reduces leakage or loss by guiding a current formed in a ground layer.

An electronic device may include a plurality of components therein for the purpose of implementing a plurality of functions necessary for the use. For example, since a user interface (UI) and content which may be displayed vary with the size of the display included in the electronic device, the display may have a significant influence on a user experience (UX). For this reason, the size of the display may be increasing. As such, it may be difficult to implement an antenna for transmitting/receiving a signal at the electronic device, even though a portion of a configuration of the electronic device is used as a radiator, the performance of the antenna may be reduced due to the influence of a component(s) around the antenna.

Additional aspects will be set forth in part in the description which follows and, in part, will be apparent from the description, or may be learned by practice of the presented embodiments.

In accordance with an aspect of the disclosure, an electronic device is provided. The electronic device includes a first surface, a second surface facing away from the first surface, and a side member surrounding a space between the first surface and the second surface, a display that is exposed through a substantial portion of the first surface of the housing, a first radiator that forms a portion of the side member, a printed circuit board (PCB) that is positioned within the housing and includes a ground layer, a communication circuit that is positioned on the PCB, and a conductive pattern having a length corresponding to a length of the first radiator. A first portion including one end of the conductive pattern may be positioned adjacent to the first radiator, the other end of the conductive pattern may be connected with the ground layer of the PCB, and a rest portion of the conductive pattern except for the first portion may be positioned to overlap with the ground layer, when viewed from above the first surface.

In accordance with another aspect of the disclosure, an electronic device is provided. The electronic device includes a housing that includes a front plate, a rear plate facing away from the front plate, and a side member surrounding a space between the front plate and the rear plate, the side member including a first side surface having a first conduction part and a second conduction part, a first insulation part interposed between the first conduction part and the second conduction part and being in contact with the first conduction part and the second conduction part, an internal conductive structure that is positioned between the front plate and the rear plate, a PCB that is positioned between the internal conductive structure and the rear plate, a wireless communication circuit that is positioned on the PCB and is electrically connected with a first side surface of the side member at a first point of the side member, a touchscreen display that is positioned in a space between the front plate and the internal conductive structure and includes a conductive layer parallel to the front plate, the conductive layer extending along the first side surface of the side member, when viewed from above the front plate, and a conductive pattern that includes a first end adjacent to the first insulation part and a second end electrically connected with a ground. When viewed from above the front plate, a substantial portion of the conductive pattern may overlap with the conductive layer, and the conductive pattern is interposed between the rear plate and the PCB.

According to embodiments of the disclosure, a flow of a current formed in a ground layer of a PCB by a current applied to a radiator may be guided by positioning a conductive pattern above the ground layer, thereby making it possible to prevent a current from being leaked out or from be lost due to a stacked structure or an adjacent component. As such, radiation efficiency of the electronic device may be increased, and thus, efficiency of transmitting/receiving a signal through a radiator may be increased.

Besides, a variety of effects directly or indirectly understood through this disclosure may be provided.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 8A and 8B are views illustrating a path of a current when an electronic device according to various embodiments of the disclosure transmits/receives a signal;

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modification of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
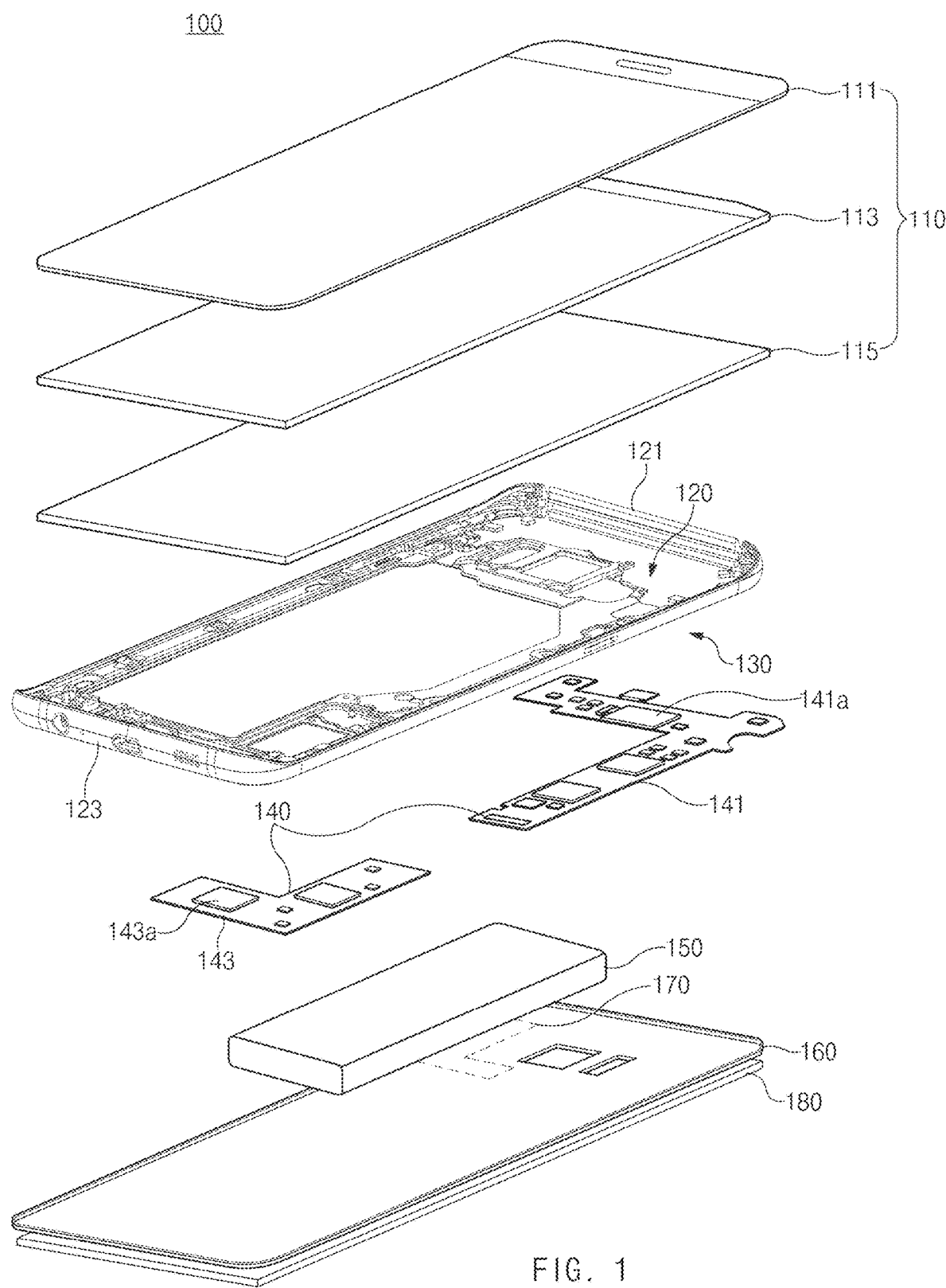
FIG. 1 is an exploded perspective view illustrating a configuration of an electronic device according to an embodiment of the disclosure.

FIG. 1 is an exploded perspective view illustrating a configuration of an electronic device according to an embodiment of the disclosure.

Referring to FIG. 1, an electronic device 100 may include a display 110, a first support member 120, a side member 130, a printed circuit board (PCB) 140, a battery 150, a second support member 160, a first conductive pattern 170, and a rear cover 180. According to an embodiment, the electronic device 100 may not include some of the components illustrated in FIG. 1 or may further include one or more components not illustrated in FIG. 1. For another example, the order in which the components included in the electronic device 100 are stacked may be different from the stacked order illustrated in FIG. 1. According to an embodiment, a housing may include a front plate (e.g., the display 110 or a cover glass 111), a rear plate (e.g., the rear cover 180) facing away from the front plate, and the side member 130 surrounding a space between the front plate and the rear plate.

According to an embodiment, the display 110 may display content. According to an embodiment, the display 110 may include the cover glass 111, a display panel 113, and a shield layer (or a conductive layer) 115. According to an embodiment, the display 110 may be exposed through a region of the front plate of the housing. According to an embodiment, the display 110 may further include a touch panel (not illustrated) for receiving a user input. The user input (e.g., a touch input) may be received through the touch panel.

According to an embodiment, the cover glass 111 may transmit light generated by the display panel 113. According to an embodiment, a user may touch a portion (e.g., a finger) of his/her body on the cover glass 111 to perform touch. For example, the cover glass 111 may be formed of tempered glass, reinforced plastics, a flexible polymer material, or the like.

According to an embodiment, the display panel 113 may be disposed below the cover glass 111. According to an embodiment, the display panel 113 may display content. The display panel 113 may include a plurality of pixels for displaying content. According to an embodiment, the display panel 113 may be electrically connected with the PCB 140. The display panel 113 may be provided with data associated with content (e.g., a text, image content, video content, an UI, or the like) and may display content depending on the provided data.

According to an embodiment, the shield layer 115 may be interposed between the display panel 113 and the first support member 120 (or the side member 130). For example, the display 110 may include the shield layer 115 parallel to the front plate of the housing of the electronic device 100. The shield layer 115 may extend along a side surface of the side member 130, when viewed from above a front surface of the electronic device 100.

The shield layer 115 may prevent an electro-magnetic interference between the display panel 113 and the PCB 140. According to an embodiment, the shield layer 115 may include a thin film sheet or plate, which is formed of copper (Cu) or graphite. In the case where the shield layer 115 is Cu or graphite, components included in the electronic device 100 may be grounded to the shield layer 115. In other words, the shield layer 115 may be used as a ground layer.

According to an embodiment, the first support member 120 may be positioned between the display 110 and the second support member 160. For another example, the first support member 120 may be positioned inside the side member 130. According to an embodiment, the first support member 120 may fix internal components of the electronic device 100. For example, the first support member 120 may fix the PCB 140. According to an embodiment, at least a portion of the first support member 120 may include a conductive material (e.g., metal). For example, the first support member 120 may be an internal conductive support member.

According to an embodiment, the first support member 120 may include a first radiator 121 and a second radiator 123. For example, the first radiator 121 and the second radiator 123 may extend from the first support member 120. According to an embodiment, the first radiator (or a first conduction part) 121 and the second radiator (or a second conduction part) 123 may form at least a portion of the side member 130. For example, the side member 130 may include the first radiator 121 and the second radiator 123.

According to an embodiment, the first radiator 121 and the second radiator 123 may transmit/receive a signal in a specified frequency band when a current (or a radiation current) is applied to the first radiator 121 and the second radiator 123. For example, the first radiator 121 and the second radiator 123 may transmit/receive the signal in the specified frequency band by using a current applied by the PCB 140.

According to an embodiment, the side member 130 may surround a space between the display 110 and the rear cover 180. According to an embodiment, at least a portion of the side member 130 may be formed of a conductive material. For example, the side member 130 may include at least one side surface. The at least one side surface of the side member 130 may include, for example, a first conduction part, a second conduction part, and a first insulation part interposed between the first conduction part and the second conduction part. According to an embodiment, at least a portion of the side member 130 may operate as a plurality of radiators which may transmit/receive signals in different frequency bands. For example, the first conduction part or the second conduction part may be used as an antenna radiator for transmitting/receiving a signal.

According to an embodiment, the side member 130 may be integrally formed with the first support member 120. According to another embodiment, the side member 130 may be implemented in the form of coupling with the first support member 120.

According to another embodiment, the side member 130 may be included in a housing (not illustrated). The housing may include, for example, a first surface, a second surface facing away from the first surface, and the side member 130 surrounding a space between the first surface and the second surface. According to an embodiment, the housing may include a first conduction part and a second conduction part, and may further include a first insulation part which is interposed between the first conduction part and the second conduction part and is in contact with the first conduction part and the second conduction part. As such, the electronic device 100 may transmit/receive respective signals through the first conduction part and the second conduction part.

According to an embodiment, the PCB 140 may include a plurality of components for an operation of the electronic device 100. The plurality of components may be mounted on the PCB 140, and the plurality of components mounted may be electrically connected to each other through a printed circuit. The plurality of components may include, for example, an application processor (AP), a communication processor (CP), a display driver integrated circuit (DDI), or communication circuits (or a communication module) 141*a* and 143*a*. In the disclosure, the PCB 140 may be referred to as a "main board" or "printed board assembly (PBA)". According to an embodiment, the PCB 140 may include a plurality of PCBs. The plurality of PCBs may include, for example, a first PCB (or a main PCB) 141 and a second PCB (or a sub PCB) 143. The plurality of PCBs 141 and 143 may be electrically connected to each other.

According to an embodiment, the communication circuits 141*a* and 143*a* may be positioned on the PCB 140. The communication circuits 141*a* and 143*a* may include, for example, a radio frequency (RF) circuit which may feed an antenna element to transmit or receive a signal. In the disclosure, the "feeding" may mean an operation in which the communication circuits 141*a* and 143*a* apply a current (or a radiation current) to antenna radiators. According to an embodiment, the communication circuits 141*a* and 143*a* may be electrically connected at a first point of the side member 130. For example, the first point may be a point included in the first conduction part and the second conduction part included in the side member 130.

According to an embodiment, the PCB 140 may include a ground layer (or a ground part). The ground layer may be formed in one layer (e.g., a ground layer) of a plurality of layers of the PCB 140. The ground layer may be electrically connected with an antenna element to form an electrical path for transmitting or receiving a signal. In other words, the ground layer may be implemented with a conductive layer which is on the PCB 140.

According to an embodiment, a first conductive pattern 170 may be connected with the antenna ground to which the radiators 121 and 123 are connected. The antenna ground may be, for example, a ground layer which may be connected with a ground part of an antenna radiator and may include the first support member 120 electrically connected with a ground layer of the PCB 140. Also, the ground layer may further include a ground layer included in the display 110. The ground layer included in the display 110 may be electrically connected with the ground layer of the PCB 140. According to an embodiment, the first conductive pattern 170 may be directly connected with the PCB 140, or may be directly connected with the ground layer of the first support member 120 or the ground layer of the display 110.

According to an embodiment, the battery 150 may convert chemical energy and electrical energy bidirectionally. For example, the battery 150 may convert chemical energy into electrical energy and may supply the electrical energy to the display 110 and various components (or modules) mounted on the PCB 140. The battery 150 may convert and store electrical energy supplied from the outside into chemical energy. For example, the battery 150 may be a secondary cell which may be rechargeable. A charging/discharging state of the battery 150 may be managed by a battery management module (or a battery management system (BMS)) of the PCB 140.

According to an embodiment, the second support member 160 may be coupled on a rear surface of the first support member 120. For example, the second support member 160 may be formed of plastic.

According to an embodiment, the first conductive pattern 170 may be positioned in the second support member 160. For example, the first conductive pattern 170 may be interposed between the second support member 160 and the rear cover 180.

According to an embodiment, one end of the first conductive pattern 170 may be positioned adjacent to a radiator included in the side member 130, and the other end of the first conductive pattern 170 may be connected with a ground of the PCB 140. As such, the first conductive pattern 170 may guide an electrical path of a current formed in the ground. For example, when viewed from above the rear cover 180, it may seem that at least a portion including the other end of the first conductive pattern 170 overlaps with the ground of the PCB 140. For another example, it may seem that at least a portion including the other end of the first conductive pattern 170 overlaps with the shield layer 115 included in the display 110. According to an embodiment, the first conductive pattern 170 may have a length corresponding to a length of a radiator included in the side member 130.

According to an embodiment, the rear cover 180 may be coupled on a rear surface of the electronic device 100 (or may be positioned below the second support member 160). According to an embodiment, the rear cover 180 may be integrally formed with the side member 130 or the second support member 160. For example, the rear cover 180 may be formed of tempered glass, plastic, or the like.

Figure 2:
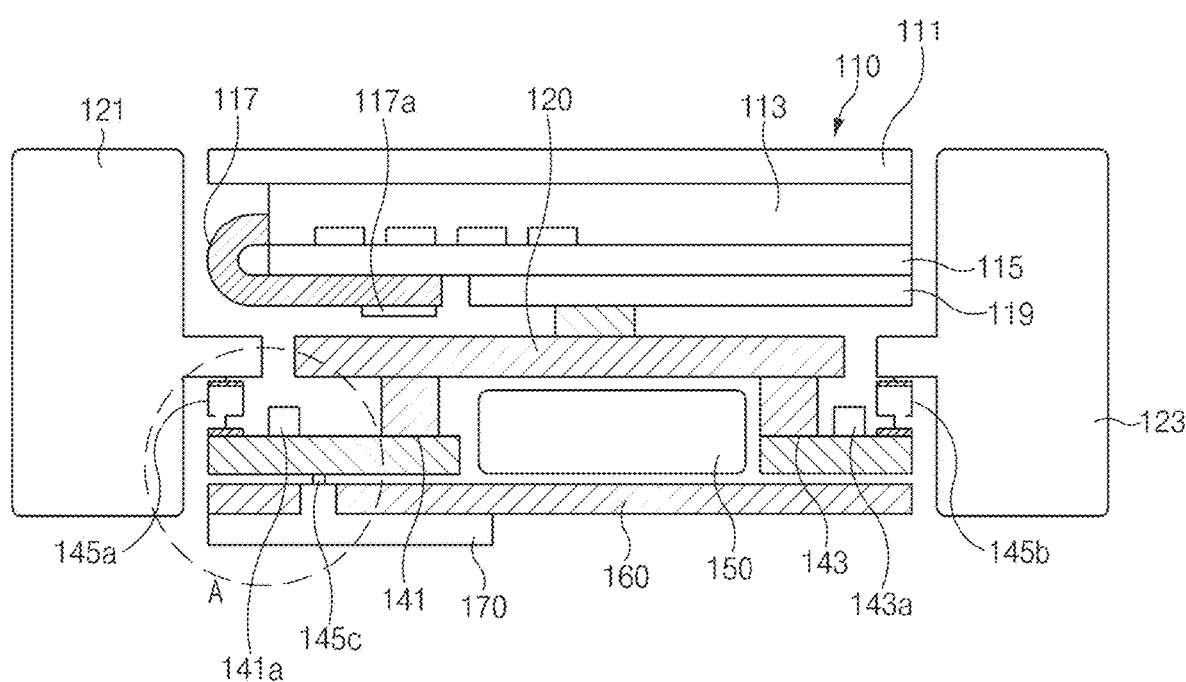
FIG. 2 is a vertical sectional view of an electronic device according to an embodiment of the disclosure.

FIG. 2 is a vertical sectional view of an electronic device according to an embodiment of the disclosure.

Referring to FIG. 2, the electronic device 100 may transmit/receive a signal by using the first radiator 121 and the second radiator 123.

According to an embodiment, the display 110 may include the cover glass 111, the display panel 113, the shield layer 115, a flexible PCB 117, and a conductive tape 119.

According to an embodiment, the display 110 may display content by using a plurality of pixels included in the display panel 113. The display panel 113 may be any one of a liquid crystal display (LCD) panel, a thin film transistor-LCD (TFT-LCD) panel, a light emitting diode (LED) display panel, and an organic LED (OLED) display panel. For example, the plurality of pixels may be implemented with an LCD pixel, an LED pixel, and an OLED pixel According to an embodiment, the FPCB 117 may include a DDI 117a. According to an embodiment, the DDI 117a may be mounted on the FPCB 117, and may be electrically connected with the pixels of the display panel 113 through a circuit printed on the FPCB 117. According to an embodiment, the DDI 117a may transmit content data to the pixels for the purpose of displaying content.

According to an embodiment, the conductive tape 119 may couple the display 110 to the first support member 120.

According to an embodiment, the side member 130 may include the first radiator 121 and/or the second radiator 123. For example, the first radiator 121 and/or the second radiator 123 may form a portion of the side member 130. The side member 130 may include, for example, a first edge formed with a first length, a second edge formed parallel to the first edge with the first length, a third edge formed with a second length, and a fourth edge formed parallel to the third edge with the second length. For example, the first radiator 121 and/or the second radiator 123 may be included in the first edge and the second edge.

According to an embodiment, the first radiator 121 and/or the second radiator 123 may be electrically connected with the communication circuits 141a and 143a included in the PCB 140. The communication circuits 141a and 143a included in the PCB 140 may be connected with the first radiator 121 and/or the second radiator 123 through connection members (e.g., a C-clip) 145a and 145b. For another example, the first radiator 121 and/or the second radiator 123 may be electrically connected with the ground layer included in the PCB 140.

According to an embodiment, the communication circuits 141a and 143a may apply a current (or a radiation current) to the first radiator 121 and/or the second radiator 123 by using a power supplied from the battery 150. For example, the first radiator 121 may transmit/receive a signal in a first frequency band through a first electrical path formed by the current applied from the first communication circuit 141a. For example, the second radiator 123 may transmit/receive a signal in a second frequency band through a second electrical path formed by the current applied from the second communication circuit 143a. According to an embodiment, the electronic device 100 may transmit/receive signals in different frequency bands through the first radiator 121 and/or the second radiator 123.

According to an embodiment, the current applied to the first radiator 121 and/or the second radiator 123 may cause a current to be generated in the ground layer included in the PCB 140. The current generated in the ground layer may form an electrical path so as to correspond to a current flowing to the first radiator 121 and/or the second radiator 123.

According to an embodiment, the first conductive pattern 170 may be positioned in a specified region of a rear surface of the second support member 160. For example, the specified region may be a region where a current flows to a ground layer of the first PCB 141 by the first communication circuit 141a connected with the first radiator 121. According to an embodiment, a first portion including one end of the first conductive pattern 170 may be positioned adjacent to the first radiator 121, and the other end of the first conductive pattern 170 may be electrically connected with the ground layer of the first PCB 141. According to an embodiment, the rest portion of the first conductive pattern 170 except for the first portion may overlap with the ground layer of the first PCB 141, when viewed from above the display 110.

According to another embodiment, the first conductive pattern 170 may be positioned in a specified region, which is adjacent to the second radiator 123, of the rear surface of the second support member 160. For example, the specified region may be a region where a current flows to a ground layer of the second PCB 143 by the second communication circuit 143a connected with the second radiator 123.

Figure 3:
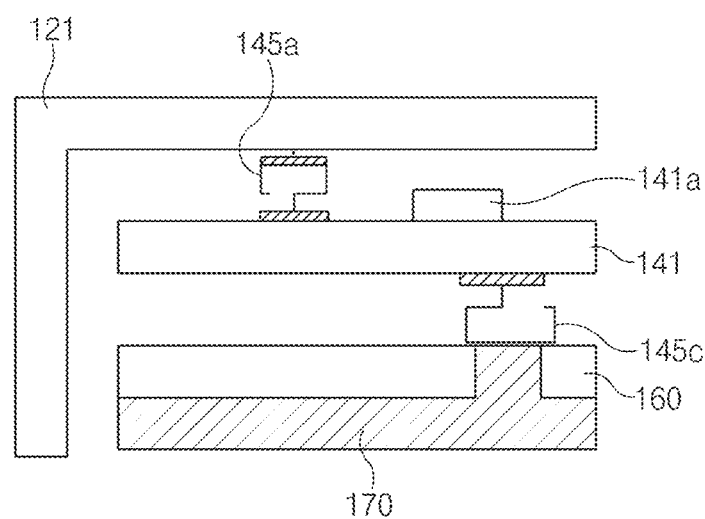
FIG. 3 is an enlarged view of a portion "A" of FIG. 2 according to an embodiment of the disclosure.

FIG. 3 is an enlarged view of a portion "A" of FIG. 2 according to an embodiment of the disclosure.

Referring to FIG. 3, one end of the first conductive pattern 170 may be positioned adjacent to the first antenna radiator 121, and the other end of the first conductive pattern 170 may be electrically connected with the ground layer of the first PCB 141. The first antenna radiator 121 may form, for example, at least a portion of the side member 130.

According to an embodiment, the other end of the first conductive pattern 170 may be electrically connected with the ground layer of the first PCB 141 through the second support member 160. For example, the first conductive pattern 170 may include a flexible conductive member which is interposed between the first conductive pattern 170 and the first PCB 141 and is in contact with the first conductive pattern 170 and the first PCB 141. For example, the other end of the first conductive pattern 170 may be electrically connected with the ground layer of the first PCB 141 through the C-clip 145c.

Figure 4B:
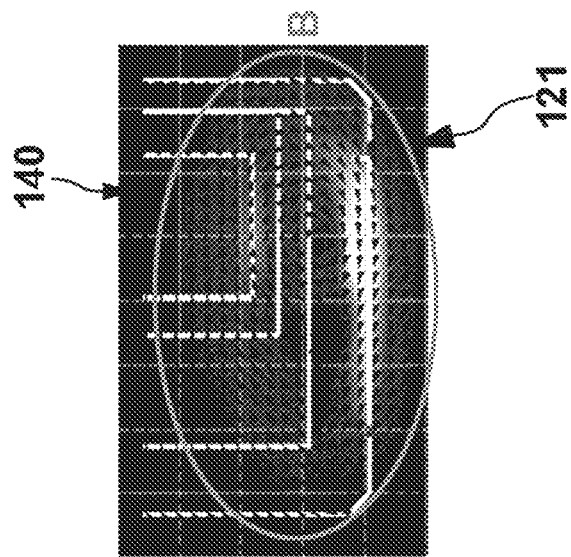
FIGS. 4A and 4B are views illustrating a path of a current when an electronic device transmits/receives a signal according to various embodiments of the disclosure.
Figure 4A:
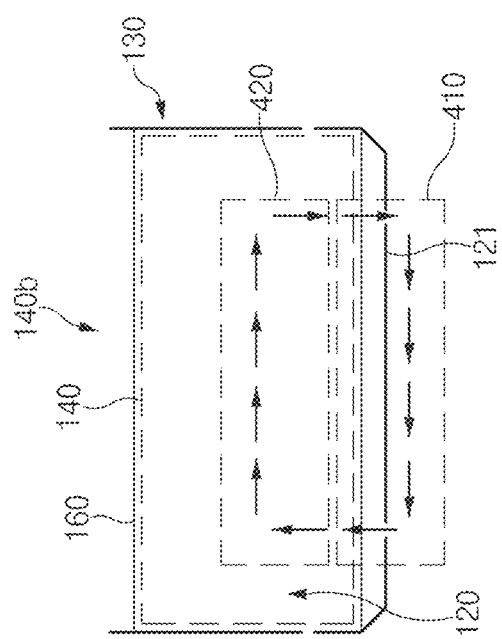

FIGS. 4A and 4B are views illustrating a path of a current when an electronic device transmits/receives a signal according to various embodiments of the disclosure.

Referring to FIGS. 4A and 4B, when a current (or a radiation current) is applied to the first radiator 121 included in the side member 130, a signal in a low frequency band (e.g., ranging from 0.6 GHz to 0.9 GHz) may be transmitted/received. For another example, a flow of a current for receiving the signal in the low frequency band may occur in the first radiator 121 and a ground layer 140b of the PCB 140 (e.g., the first PCB 141). According to an embodiment, a description to be given below may be identically applied to the second radiator 123 included in the side member 130 and the ground layer of the PCB 140 (e.g., the second PCB 143).

Referring to FIG. 4A, a current may be applied to the first radiator 121 by a first communication circuit (e.g., the first communication circuit 141a of FIG. 2), and thus, a first electrical path 410 for receiving a signal in the low frequency band may be formed. For example, the first radiator 121 may form at least a portion of the side member 130. According to an embodiment, a second electrical path 420 may be formed in the ground layer 140b of the PCB 140 by the current applied to the first radiator 121. The first electrical path 410 and the second electrical path 420 may correspond to each other. For example, the first electrical path 410 and the second electrical path 420 may be formed symmetrically. For example, the first electrical path 410 and the second electrical path 420 may form a flow of a current so as to include an upper side surface of the housing.

Referring to FIG. 4B, that a flow of a current occurs in a region "B" may be observed from a result of measuring (or simulating) a radiation current distribution of the first radiator 121 and the ground layer 140b of the PCB 140. The region "B" may correspond to the first electrical path 410 and the second electrical path 420.

According to an embodiment, in the case where the first electrical path 410 and the second electrical path 420 are symmetrical to each other and the magnitudes of currents flowing through the first electrical path 410 and the second electrical path 420 are similar to each other, the radiation efficiency of an antenna may be high. For example, the electronic device 100 may transmit/receive a signal in a specified frequency band (e.g., the low frequency band) without loss of an output through the first radiator 121. For example, in the case where a current flowing to the first radiator 121 is leaked out because a ground is adjacent to the first radiator 121 or in the case where a current of the ground layer 140b is lost due to a plurality of components mounted on the PCB 140 or a stacked ground, the loss of output may occur, thereby reducing radiation performance associated with the specified frequency band.

According to an embodiment, a first conductive pattern (e.g., the first conductive pattern 170 of FIG. 2) may guide a current flowing to a ground layer to allow the first electrical path 410 and the second electrical path 420 to be formed symmetrically.

Figure 5:
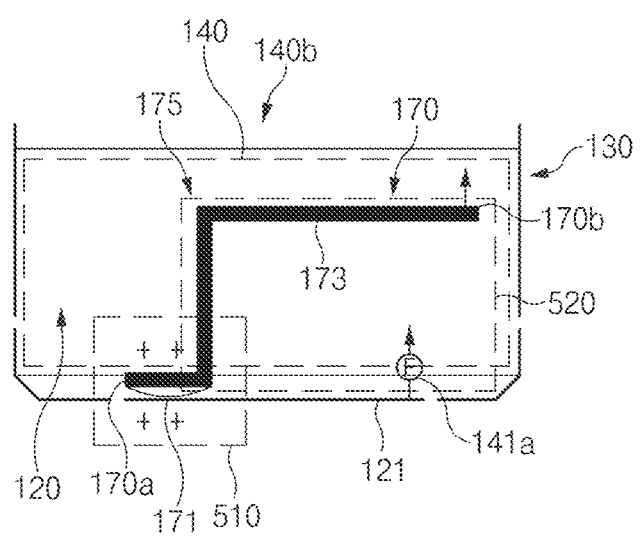
FIG. 5 is a view illustrating a conductive pattern formed in an electronic device according to an embodiment of the disclosure.

FIG. 5 is a view illustrating a conductive pattern formed in an electronic device according to an embodiment of the disclosure.

Referring to FIG. 5, the first conductive pattern 170 according to an embodiment may be formed on a rear surface of the second support member 160 to guide a current generated in the ground layer 140b by a current (or a radiation current) applied to the first radiator 121 from the PCB 140. For example, the first radiator 121 may be a radiator for receiving a signal in the low frequency band. For example, the first radiator 121 may form a portion of the side member 130.

According to an embodiment, a first portion 171 including one end 170a of the first conductive pattern 170 may be positioned adjacent to the first radiator 121. For example, the first portion 171 may be interposed between the first radiator 121 and the ground layer 140b of the PCB 140. For example, the first portion 171 may be positioned in an empty space between the first radiator 121 and the ground layer 140b of the PCB 140. For another example, when viewed from above a display (e.g., the display 110 of FIG. 2), at least a portion of the first portion 171 may be positioned to overlap with the PCB 140. According to an embodiment, the first portion 171 of the first conductive pattern 170 may be spaced from the first radiator 121 by a specified distance.

For example, the first conductive pattern 170 may include a first extension (or the first portion 171), a second extension, and a third extension (or a second portion 173). The first extension may include a first end and a second end, and may extend along not all but a portion of the first conduction part of the side member 130. The first end of the first extension may be positioned adjacent to the insulation part of the side member 130. As in the first extension, the second extension may include a first end and a second end, and may extend substantially vertically to the first extension. The first end of the second extension may be electrically connected with the second end of the first extension. As in the second extension, the third extension may include a first end and a second end, and may extend substantially vertically to the second extension. The first end of the third extension may be electrically connected with the second end of the second extension, and the second end of the third extension may be electrically connected with the ground.

According to an embodiment, the first portion 171 of the first conductive pattern 170 may be positioned at a specified portion 510 of the first radiator 121. The specified portion 510 may be a portion having the highest voltage (or the highest radiation voltage) upon receiving a signal in a specified frequency band. For example, the specified portion 510 may be a segment portion of the first radiator 121. For another example, the specified portion 510 may be a central portion of the first radiator 121. For example, a relatively high voltage may be formed at the first portion 171 of the first conductive pattern 170, and thus, a current formed in the ground layer 140b may be efficiently guided.

According to an embodiment, the other end 170b of the first conductive pattern 170 may be electrically connected with the ground layer 140b of the PCB 140. For example, the other end 170b of the first conductive pattern 170 may be electrically connected with the ground layer 140b of the PCB 140.

According to an embodiment, the rest portion 173 of the first conductive pattern 170 except for the first portion 171 may be positioned to overlap with the ground layer 140b of the PCB 140, when viewed from above a display (e.g., the display 110). For example, when viewed from above a display (e.g., the display 110 of FIG. 2), in the case where a current is applied to the first radiator 121 by the first communication circuit 141a, the rest portion 173 of the first conductive pattern 170 may be positioned to overlap with a region 520 where a current generated in the ground layer 140b by the applied current flows. For example, the first conductive pattern 170 may guide a current flowing to the ground layer 140b, thus allowing a path of a current formed at the first radiator 121 and a path of a current formed at the ground layer 140b to be formed symmetrically to each other.

According to an embodiment, the rest portion 173 of the first conductive pattern 170 may be positioned to overlap with an electrical path formed in the ground layer 140b, when viewed from above a display (e.g., the display 110). According to an embodiment, the first conductive pattern 170 may include at least one bending part 175 such that the rest portion 173 is disposed at a specified position. The specified position may be on a region where a current generated in the ground layer 140b flows. According to an embodiment, at least a portion of the rest portion 173 of the first conductive pattern 170 may be formed symmetrically to the first radiator 121 with respect to the first portion 171. According to an embodiment, the rest portion 173 of the first conductive pattern 170 may be not less than 80% of the whole length of the first conductive pattern 170. For example, the first conductive pattern 170 may efficiently guide a current generated in the ground layer 140b.

Figure 6:
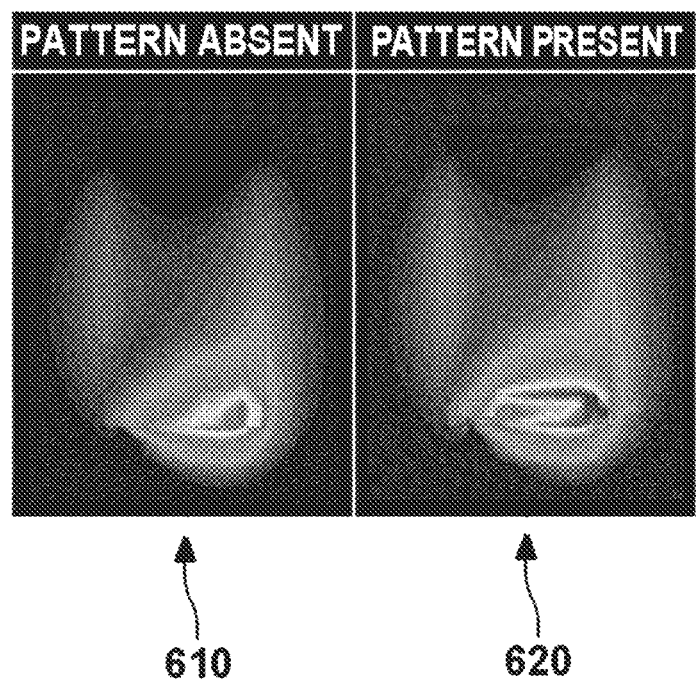
FIG. 6 is a view illustrating a current distribution formed to receive a signal in a specified frequency band at an electronic device according to an embodiment of the disclosure.

FIG. 6 is a view illustrating a current distribution formed to receive a signal in a specified frequency band at an electronic device according to an embodiment of the disclosure.

Referring to FIG. 6, the electronic device 100 may transmit/receive a signal (e.g., 730 MHz) in a specified frequency band through the first radiator 121. In the electronic device 100, a flow of a current for transmitting/receiving the signal in the specified frequency band may occur at the first radiator 121 and in the ground layer 140b of the PCB 140.

In the case 610 where the first conductive pattern 170 is not formed in the electronic device 100, a distribution of a current formed at the first radiator 121 and a distribution of a current format in the ground layer 140b may not be symmetrical. In the case 620 where the first conductive pattern 170 is formed in the electronic device 100, a distribution of a current formed at the first radiator 121 and a distribution of a current formed in the ground layer 140b may be symmetrical compared with the case 610. As such, the radiation efficiency of the electronic device 100 through the first radiator 121 may increase.

FIGS. 7A through 7D are views illustrating various embodiments of a conductive pattern of an electronic device according to an embodiment of the disclosure.

Figure 7A:
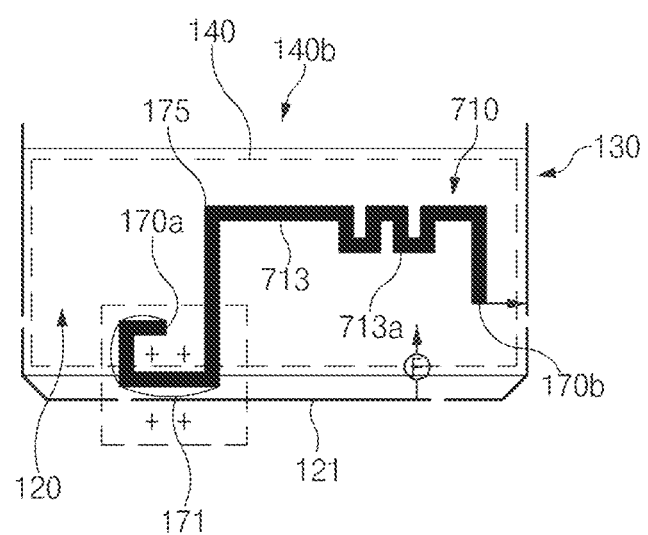
FIGS. 7A, 7B, 7C and 7D are views illustrating various embodiments of a conductive pattern of an electronic device according to various embodiments of the disclosure.

Referring to FIG. 7A, in a second conductive pattern 710, patterns may extend from a first portion 711 and a second portion 713. The pattern extended from the first portion 711 may be formed in the form of "U" above the ground layer of the PCB 140 (e.g., the first PCB 141). The pattern extended from the second portion 713 may be formed in the form of "L" in a direction of the first radiator 121 and above the ground layer of the PCB 140. According to an embodiment, the second conductive pattern 710 may include a meander structure 713a at the center of the second portion 713. As such, a length of the second conductive pattern 710 may be formed to correspond to a length of the first radiator 121, and thus, the coupling effect of the first radiator 121 may increase.

Figure 7B:
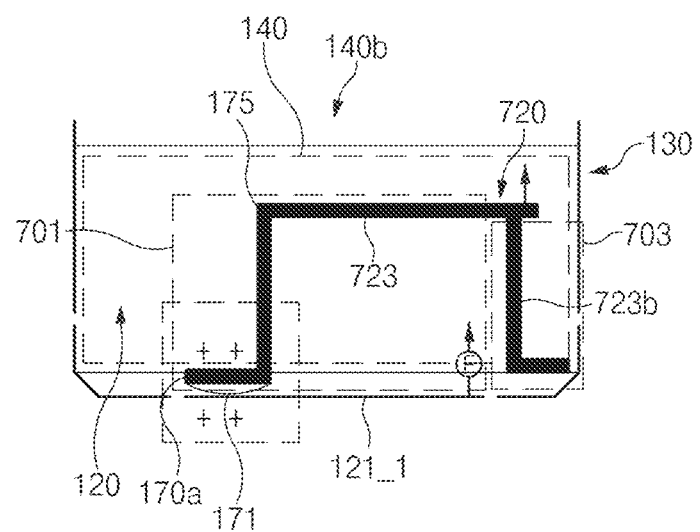

Referring to FIG. 7B, in a third conductive pattern 720, a pattern may extend from a second portion 723. The pattern 723b extended from the second portion 723 may be formed in the form of "L" above the ground layer of the PCB 140. As such, the electronic device 100 may transmit/receive a signal in the low frequency band through the first radiator 121 and a first region 701, and may transmit/receive a signal in the high frequency band through a third radiator 121_1 and a second region 703. In other words, radiators having different operating characteristics (e.g., different frequency band characteristics) may be connected with the same ground layer 140b through the first region 701 and the second region 703 of the third conductive pattern 720 and may transmit/receive signals in different frequency bands.

Figure 7C:
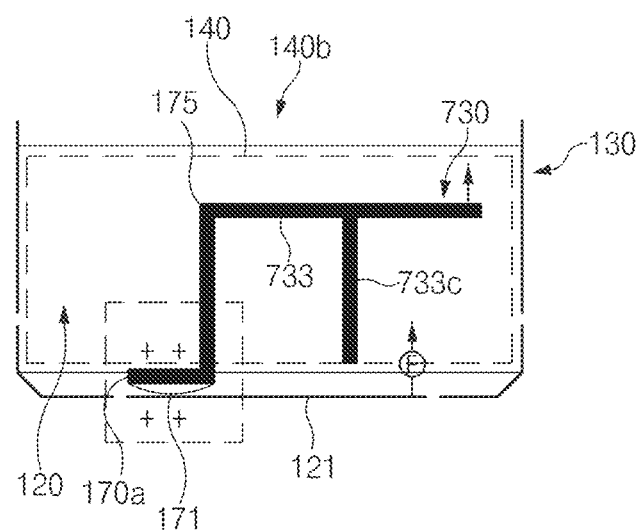

Referring to FIG. 7C, in a fourth conductive pattern 730, a pattern may extend from a second portion 733. The pattern 733c extended from the second portion 733 may be formed in the form of a branch above the ground layer of the PCB 140. As such, a ground effect, which may be reduced in a complicated, stacked ground structure of the electronic device 100, may be improved (or increased).

Figure 7D:
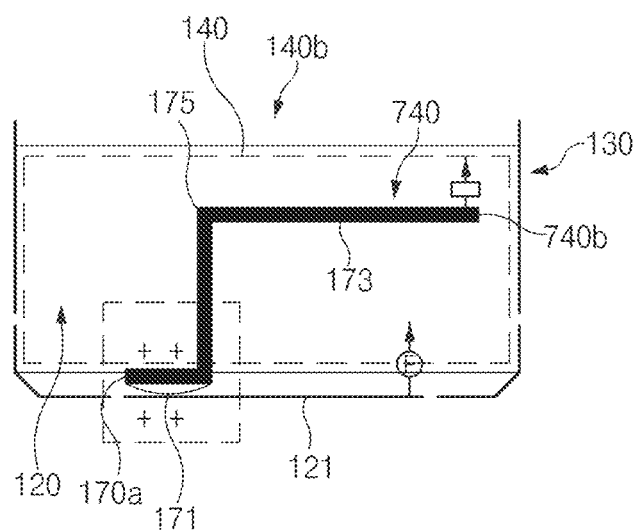

Referring to FIG. 7D, a tunable element (e.g., a capacitor, an inductor, or the like) may be connected between a second portion 743 (e.g., the other end 740b) of a fifth conductive pattern 740 and the ground layer 140b of the PCB 140. As such, the coupling effect of the fifth conductive pattern 740 may be increased.

FIGS. 8A and 8B are views illustrating a path of a current when an electronic device transmits/receives a signal according to various embodiments of the disclosure.

Referring to FIGS. 8A and 8B, when a current (or a radiation current) is applied to a third radiator 121_1 included in the side member 130, the electronic device 100 may transmit/receive a signal in a mid or high frequency band (e.g., ranging from 1.5 GHz to 2.4 GHz). For another example, a flow of a current for receiving a signal in the mid or high frequency band may occur at the third radiator 121_1 and in the ground layer 140b of the PCB 140 (e.g., the first PCB 141).

Referring to FIG. 8A, a current may be applied to the third radiator 121_1 by a third communication circuit (not illustrated) of the PCB 140, and thus, a third electrical path 810 for receiving a signal in the mid frequency band may be formed. The third radiator 121_1 may form at least a portion of the side member 130. According to an embodiment, a fourth electrical path 820 may be formed in the ground layer 140b of the PCB 140 by the third electrical path 810 formed at the third radiator 121_1. The third electrical path 810 and the fourth electrical path 820 may correspond to each other. For example, the fourth electrical path 820 may be formed symmetrically to the third electrical path 810. For example, the third electrical path 810 and the fourth electrical path 820 may form a flow of a current at a corner portion of the side member 130 (or the third radiator 121_1).

According to an embodiment, the third electrical path 810 and the fourth electrical path 820 may be shorter than the first electrical path 410 and the second electrical path 420 of FIG. 4A. For example, the electronic device 100 may transmit/receive a signal in the mid or high frequency band through the third radiator 121_1.

Referring to FIG. 8B, that a flow of a current occurs in a region "C" may be observed from a result of measuring (or simulating) a radiation current distribution of the third radiator 121_1 and the ground layer 140b of the PCB 140. The region "C" may correspond to a flow of a current, which is composed of the third electrical path 810 and the fourth electrical path 820.

According to an embodiment, in the case where the third electrical path 810 and the fourth electrical path 820 are symmetrical to each other and the magnitudes of currents flowing through the third electrical path 810 and the fourth electrical path 820 are similar to each other, the radiation efficiency may be high. According to an embodiment, a sixth conductive pattern may guide a current flowing to the ground layer of the PCB 140 to allow the third electrical path 810 and the fourth electrical path 820 to be formed symmetrically.

Figure 9:
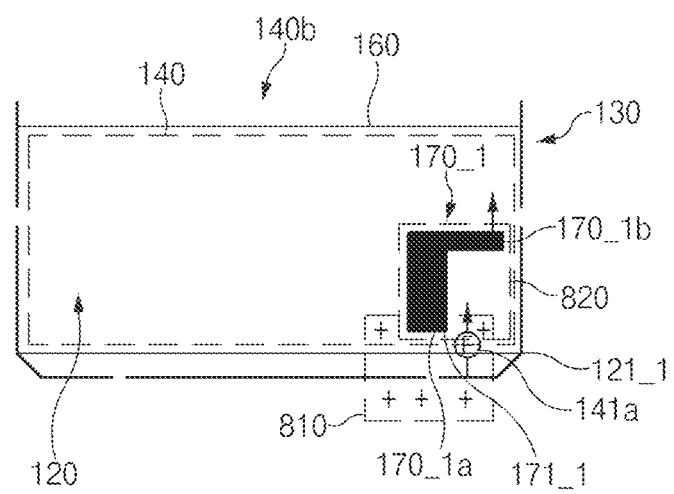
FIG. 9 is a view illustrating a conductive pattern formed in an electronic device according to an embodiment of the disclosure.

FIG. 9 is a view illustrating a conductive pattern formed in an electronic device according to an embodiment of the disclosure.

Referring to FIG. 9, the sixth conductive pattern may be positioned on a rear surface of the second support member 160 to guide a current generated in the ground layer 140b by a current (or a radiation current) applied to the third radiator 121_1 by the communication circuit 141a of the PCB 140. For example, the third radiator 121_1 may be a radiator for receiving a signal in the mid or high frequency band. The third radiator 121_1 may form, for example, a portion of the side member 130.

According to an embodiment, a first portion 171_1 including one end 170_1a of the sixth conductive pattern 170_1 may be positioned adjacent to the third radiator 121_1. According to an embodiment, the first portion 171_1 of the sixth conductive pattern 170_1 may be spaced from the third radiator 121_1 by a specified distance.

For example, the sixth conductive pattern 170_1 may include a first extension (or the first portion 171_1) and a second extension (or a second portion 173_1). The first extension 171_1 may include a first end 170_1a and a second end, and may extend substantially vertically to a conduction part (e.g., a first radiator) of the side member 130, and the first end of the first extension may be positioned adjacent to an insulation part. The second extension may include a first end and a second end, and may extend substantially vertically to the first extension. The first end of the second extension may be electrically connected with the second end of the first extension, and the second end of the second extension may be electrically connected with the ground.

According to an embodiment, the first portion 171_1 of the sixth conductive pattern 170_1 may be positioned at a specified portion 910 of the third radiator 121_1. For example, the specified portion 910 may be positioned at a segment portion of the third radiator 121_1. For example, a relatively high voltage (or radiation voltage) (or a high voltage compared to another portion) may be formed at the first portion 171_1 of the sixth conductive pattern 170_1, and thus, a current formed in the ground layer 140b may be efficiently guided.

According to an embodiment, the other end 170_1b of the sixth conductive pattern 170_1 may be electrically connected with the ground layer 140b of the PCB 140. According to an embodiment, the rest portion 173' of the sixth conductive pattern 170_1 except for the first portion 171_1 may be positioned to overlap with the ground layer 140b of the PCB 140, when viewed from above a display (e.g., the display 110). As such, the sixth conductive pattern 170_1 may guide a current generated in the ground layer 140b.

Figure 10:
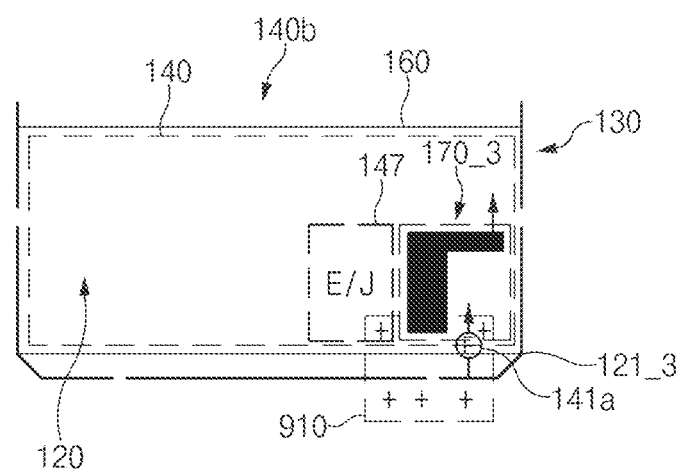
FIG. 10 is a view illustrating a conductive pattern formed adjacent to a configuration of an electronic device according to an embodiment of the disclosure.

FIG. 10 is a view illustrating a conductive pattern formed adjacent to a configuration of an electronic device according to an embodiment of the disclosure.

Referring to FIG. 10, a seventh conductive pattern 170_3 may prevent the reduction of antenna efficiency by a component (e.g., an earphone jack (E/J) 147) adjacent to a fourth radiator 121_3.

According to an embodiment, the seventh conductive pattern 1703 may be formed to be similar to the sixth conductive pattern 170_1 of FIG. 9. The component (e.g., the earphone jack (E/J) 147) mounted on the PCB 140 may be positioned in the vicinity of a fourth radiator 121_3. A parasitic capacitance (or a parasitic capacitor) may occur by the component positioned at the fourth radiator 121_3. As such, a current formed in the ground layer 140b included in the PCB 140 may be applied to the parasitic capacitance of the adjacent component 147, and radiation efficiency of an antenna may be reduced.

According to an embodiment, the seventh conductive pattern 170_3 may reduce a current to be applied to the parasitic capacitance of the adjacent component 147 by guiding a flow of a current formed in the ground layer 140b. As such, the radiation efficiency through the fourth radiator 121_3 of the electronic device 100 may increase.

Figure 11:
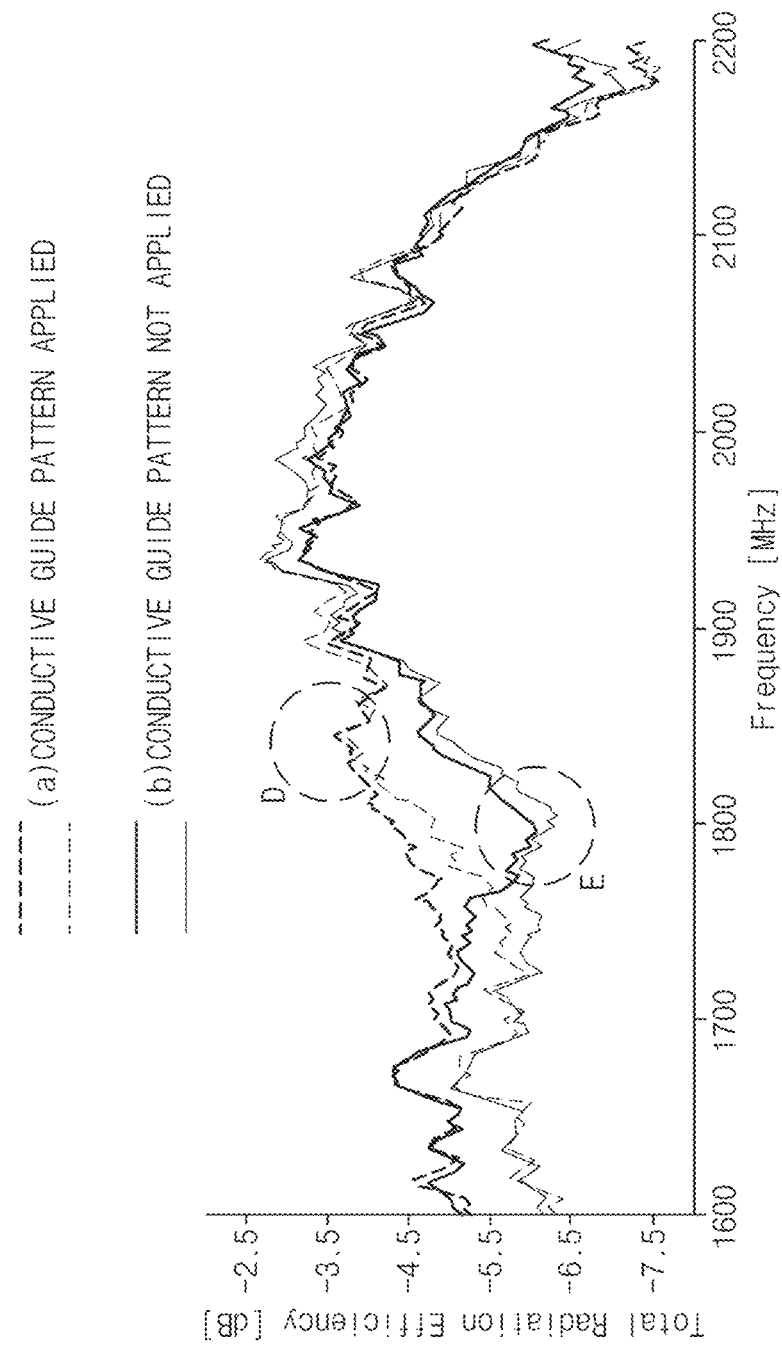
FIG. 11 is a graph illustrating radiation efficiency of an electronic device in which a conductive pattern according to an embodiment of the disclosure.

FIG. 11 is a graph illustrating radiation efficiency of an electronic device in which a conductive pattern according to an embodiment of the disclosure.

Referring to FIG. 11, in the case where the electronic device 100 includes a conductive pattern, radiation efficiency through the first radiator 121 may increase.

The radiation efficiency through the first radiator 121 of the electronic device 100 in the case "a" where a conductive pattern is applied may be improved compared with the case "b" where a conductive pattern is not applied. For example, in the electronic device 100, the radiation efficiency corresponding to a portion "D" of a graph indicating the radiation efficiency of the case "a" where the conductive pattern is applied may be higher than the radiation efficiency corresponding to a portion "E" of a graph indicating the radiation efficiency of the case "b" where the conductive pattern is not applied.

According to the embodiments of the disclosure described with reference to FIGS. 1 through 11, a flow of a current formed in a ground layer by a current applied to a radiator may be guided as at least a portion of a conductive pattern (e.g., the first conductive pattern 170 of FIG. 2, the sixth conductive pattern 170_1 of FIG. 10, or the seventh conductive pattern 170_3 of FIG. 11) is positioned to overlap with a ground layer included in an electronic device, when viewed from above a display (e.g., the display 110 of FIG. 2). Accordingly, it may be possible to reduce leakage of a current or loss of the current due to a stacked structure or an adjacent component. As such, the radiation efficiency of the electronic device 100 may be increased, and thus, efficiency of transmitting/receiving a signal through a radiator may be increased.

According to an embodiment of the disclosure, an electronic device may include a housing that includes a first surface, a second surface facing away from the first surface, and a side member 130 surrounding a space between the first surface and the second surface, a display 110 that is exposed through a substantial portion of the first surface of the housing, a first radiator 121 that forms a portion of the side member, a PCB 140 that is positioned within the housing and includes a ground layer 140b, a communication circuit 141a that is positioned on the PCB, and a conductive pattern 170, 170_1, or 170_3 that has a length corresponding to a length of the first radiator 121, 121_1, or 121_3. A first portion including one end of the conductive pattern 170, 170_1, or 170_3 may be positioned adjacent to the first radiator 121, 121_1, or 1213, the other end of the conductive pattern 170, 170_1, or 1703 may be connected with the ground layer 140b of the PCB 140, and a rest portion of the conductive pattern except for the first portion may be positioned to overlap with the ground layer 140b, when viewed from above the first surface.

According to an embodiment of the disclosure, the first portion of the conductive pattern 170, 170_1, or 170_3 may be interposed between the first radiator 121, 121_1, or 121_3 and the ground layer 140b.

According to an embodiment of the disclosure, the first portion of the conductive pattern 170, 170_1, or 170_3 may be spaced from the first radiator 121, 121_1, or 121_3 by a specified length.

According to an embodiment of the disclosure, the rest portion of the conductive pattern 170, 170_1, or 170_3 may be positioned above a region to which a current generated in the ground layer 140b by the current flows applied to the first radiator 121 by the communication circuit 141a flows.

According to an embodiment of the disclosure, the rest portion of the conductive pattern 170, 170_1, or 170_3 may be formed above an electrical path of a current generated in the ground layer 140b.

According to an embodiment of the disclosure, the conductive pattern 170, 170_1, or 170_3 may include at least one bending part.

According to an embodiment of the disclosure, at least a portion of the rest portion of the conductive pattern 170, 170_1, or 170_3 may be formed to be symmetrical to the first radiator 121 with respect to the first portion.

According to an embodiment of the disclosure, a length of the rest portion of the conductive pattern 170, 170_1, or 170_3 except for the first portion may be not less than 80% of the whole length of the conductive pattern 70, 170_1, or 170_3.

According to an embodiment of the disclosure, the first portion of the conductive pattern 170, 170_1, or 170_3 may be positioned at a specified portion of the first radiator.

According to an embodiment of the disclosure, the specified portion may be a portion having a highest voltage when the communication circuit 141a receives a signal in a specified frequency band through the first radiator 121.

According to an embodiment of the disclosure, the specified portion may be a segment portion of the first radiator 121.

According to an embodiment of the disclosure, the specified portion may be a central portion of the first radiator 121.

According to an embodiment of the disclosure, the electronic device may further include a second support member 160 coupled on the second surface of the housing 130, and the conductive pattern 170, 170_1, or 1703 may be formed at the second support member 160.

According to an embodiment of the disclosure, the other end of the conductive pattern 170, 170_1, or 170_3 may be electrically connected with the ground layer 140b of the PCB 140 through a C-clip 145c.

According to an embodiment of the disclosure, a side surface of the housing 130 may include a first edge formed with a first length, a second edge formed parallel to the first edge with the first length, a third edge formed with a second length, and a fourth edge formed parallel to the third edge with the second length, the conductive pattern 170, 170_1, or 170_3 may further include a second radiator 123 forming a portion of the side surface, the first radiator 121 may be included in the first edge, and the second radiator 123 may be included in the second edge.

According to an embodiment of the disclosure, the first radiator 121 may receive a signal in a first frequency band through a first electrical path formed by a current applied by the communication circuit 141a, and the second radiator 123 may receive a signal in a second frequency band through a second electrical path formed by a current applied by the communication circuit 141a.

According to embodiments of the disclosure, an electronic device may include a housing that includes a front plate, a rear plate facing away from the front plate, and a side member surrounding a space between the front plate and the rear plate, wherein the side member 130 includes a first side surface including a first conduction part, a second conduction part, and a first insulation part interposed between the first conduction part and the second conduction part and being in contact with the first conduction part and the second conduction part, an internal conductive structure that is positioned between the front plate and the rear plate, a PCB 140 that is positioned between the internal conductive structure and the rear plate, a wireless communication circuit that is positioned on the PCB 140 and is electrically connected with a first side surface of the side member 130 at a first point of the side member 130, a touchscreen display that is positioned in a space between the front plate and the internal conductive structure and includes a conductive layer that is parallel to the front plate and extends along the first side surface of the side member 130, when viewed from above the front plate, and a conductive pattern 170, 170_1, or 170_3 that includes a first end adjacent to the first insulation part and a second end electrically connected with a ground. When viewed from above the front plate, a substantial portion of the pattern 170, 170_1, or 170_3 may overlap with the conductive layer, and the pattern 170, 170_1, or 1703 may be interposed between the rear plate and the PCB 140.

According to an embodiment of the disclosure, the ground may be a portion of the PCB 140.

According to an embodiment of the disclosure, the electronic device may include a flexible conductive member that is interposed between the pattern 170, 170_1, or 170_3 and the PCB 140 and is in contact with the pattern 170, 170_1, or 170_3 and the PCB 140.

According to an embodiment of the disclosure, when viewed from above the front plate, the conductive pattern 170 may include a first extension that includes a first end and a second end extending along not all but a portion of the first conduction part of the side member 130, the first end of the first extension positioned adjacent to the first insulation part of the side member 130, a second extension that includes a first end and a second end and extends substantially vertically to the first extension, the first end of the second extension being electrically connected with the second end of the first extension, and a third extension that includes a first end and a second end and extends substantially vertically to the second extension, the first end of the third extension being electrically connected with the second end of the second extension and the second end of the third extension being electrically connected with the ground.

According to an embodiment of the disclosure, when viewed from above the front plate, the conductive pattern 170_1 and 170_3 may include a first extension that includes a first end and a second end and extends substantially vertically to the first conduction part of the side member 130, the first end of the first extension positioned adjacent to the first insulation part, and a second extension that includes a first end and a second end and extends substantially vertically to the first extension, the first end of the second extension being electrically connected with the second end of the first extension and the second end of the second extension being electrically connected with the ground.

Figure 12:
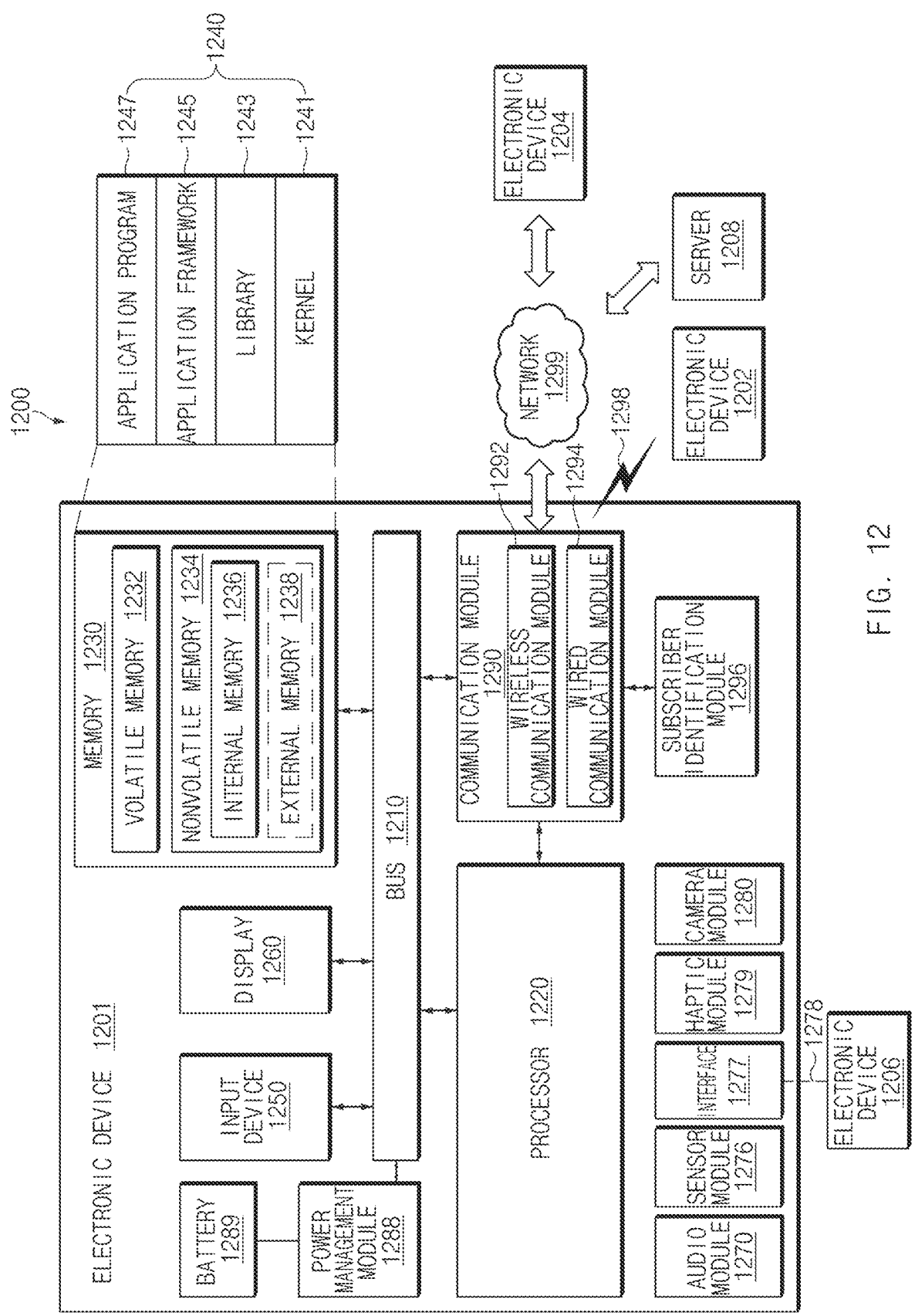
FIG. 12 illustrates a block diagram of an electronic device in a network environment according to an embodiment of the disclosure.

FIG. 12 illustrates a block diagram of an electronic device 1201 in a network environment 1200, according to an embodiment of the disclosure. An electronic device according to various embodiments of the disclosure may include various forms of devices. For example, the electronic device may include at least one of, for example, portable communication devices (e.g., smartphones), computer devices (e.g., personal digital assistants (PDAs), tablet personal computers (PCs), laptop PCs, desktop PCs, workstations, or servers), portable multimedia devices (e.g., electronic book readers or Motion Picture Experts Group (MPEG-1 or MPEG-2) Audio Layer 3 (MP3) players), portable medical devices (e.g., heartbeat measuring devices, blood glucose monitoring devices, blood pressure measuring devices, and body temperature measuring devices), cameras, or wearable devices. The wearable device may include at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), or a bio-implantable type (e.g., an implantable circuit). According to various embodiments, the electronic device may include at least one of, for example, televisions (TVs), digital versatile disc (DVD) players, audios, audio accessory devices (e.g., speakers, headphones, or headsets), refrigerators, air conditioners, cleaners, ovens, microwave ovens, washing machines, air cleaners, set-top boxes, home automation control panels, security control panels, game consoles, electronic dictionaries, electronic keys, camcorders, or electronic picture frames.

In another embodiment, the electronic device may include at least one of navigation devices, satellite navigation system (e.g., Global Navigation Satellite System (GNSS)), event data recorders (EDRs) (e.g., black box for a car, a ship, or a plane), vehicle infotainment devices (e.g., head-up display for vehicle), industrial or home robots, drones, automated teller machines (ATMs), points of sales (POSs), measuring instruments (e.g., water meters, electricity meters, or gas meters), or internet of things (e.g., light bulbs, sprinkler devices, fire alarms, thermostats, or street lamps). The electronic device according to an embodiment of the disclosure may not be limited to the above-described devices, and may provide functions of a plurality of devices like smartphones which have measurement function of personal biometric information (e.g., heart rate or blood glucose). In the disclosure, the term "user" may refer to a person who uses an electronic device or may refer to a device (e.g., an artificial intelligence electronic device) that uses the electronic device.

Referring to FIG. 12, under the network environment 1200, the electronic device 1201 (e.g., the electronic device 100 of FIG. 1) may communicate with an electronic device 1202 through local wireless communication 1298 or may communication with an electronic device 1204 or a server 1208 through a network 1299. According to an embodiment, the electronic device 1201 may communicate with the electronic device 1204 through the server 1208.

According to an embodiment, the electronic device 1201 may include a bus 1210, a processor 1220, a memory 1230, an input device 1250 (e.g., a micro-phone or a mouse), a display device 1260, an audio module 1270, a sensor module 1276, an interface 1277, a haptic module 1279, a camera module 1280, a power management module 1288, a battery 1289, a communication module 1290, and a subscriber identification module 1296. According to an embodiment, the electronic device 1201 may not include at least one (e.g., the display device 1260 or the camera module 1280) of the above-described components or may further include other component(s).

The bus 1210 may interconnect the above-described components 1220 to 1290 and may include a circuit for conveying signals (e.g., a control message or data) between the above-described components.

The processor 1220 may include one or more of a central processing unit (CPU), an AP, a graphic processing unit (GPU), an image signal processor (ISP) of a camera or a CP. According to an embodiment, the processor 1220 may be implemented with a system on chip (SoC) or a system in package (SiP). For example, the processor 1220 may drive an operating system (OS) or an application program to control at least one of another component (e.g., hardware or software component) of the electronic device 1201 connected to the processor 1220 and may process and compute various data. The processor 1220 may load a command or data, which is received from at least one of other components (e.g., the communication module 1290), into a volatile memory 1232 to process the command or data and may store the result data into a nonvolatile memory 1234.

The memory 1230 may include, for example, the volatile memory 1232 or the nonvolatile memory 1234. The volatile memory 1232 may include, for example, a random access memory (RAM) (e.g., a dynamic RAM (DRAM), a static RAM (SRAM), or a synchronous DRAM (SDRAM)). The nonvolatile memory 1234 may include, for example, a programmable read-only memory (PROM), a one time PROM (OTPROM), an erasable PROM (EPROM), an electrically EPROM (EEPROM), a mask ROM, a flash ROM, a flash memory, a hard disk drive (HDD), or a solid-state drive (SSD). In addition, the nonvolatile memory 1234 may be configured in the form of an internal memory 1236 or the form of an external memory 1238 which is available through connection only if necessary, according to the connection with the electronic device 1201. The external memory 1238 may further include a flash drive such as compact flash (CF), secure digital (SD), micro secure digital (Micro-SD), mini secure digital (Mini-SD), extreme digital (xD), a multimedia card (MMC), or a memory stick. The external memory 1238 may be operatively or physically connected with the electronic device 1201 in a wired manner (e.g., a cable or a universal serial bus (USB)) or a wireless (e.g., Bluetooth) manner.

For example, the memory 1230 may store, for example, at least one different software component, such as a command or data associated with the program 1240, of the electronic device 1201. The program 1240 may include, for example, a kernel 1241, a library 1243, an application framework 1245 or an application program (interchangeably, "application") 1247.

The input device 1250 may include a microphone, a mouse, or a keyboard. According to an embodiment, the keyboard may include a keyboard physically connected or a virtual keyboard displayed through the display device 1260.

The display device 1260 may include a display, a hologram device or a projector, and a control circuit to control a relevant device. The display may include, for example, a liquid crystal display (LCD), a light emitting diode (LED) display, an organic LED (OLED) display, a microelectromechanical systems (MEMS) display, or an electronic paper display. According to an embodiment, the display may be flexibly, transparently, or wearably implemented. The display may include a touch circuitry, which is able to detect a user's input such as a gesture input, a proximity input, or a hovering input or a pressure sensor (interchangeably, a force sensor) which is able to measure the intensity of the pressure by the touch. The touch circuit or the pressure sensor may be implemented integrally with the display or may be implemented with at least one sensor separately from the display. The hologram device may show a stereoscopic image in a space using interference of light. The projector may project light onto a screen to display an image. The screen may be located inside or outside the electronic device 1201.

The audio module 1270 may convert, for example, from a sound into an electrical signal or from an electrical signal into the sound. According to an embodiment, the audio module 1270 may acquire sound through the input device 1250 (e.g., a microphone) or may output sound through an output device (not illustrated) (e.g., a speaker or a receiver) included in the electronic device 1201, an external electronic device (e.g., the electronic device 1202 (e.g., a wireless speaker or a wireless headphone)) or an electronic device 1206 (e.g., a wired speaker or a wired headphone) connected with the electronic device 1201

The sensor module 1276 may measure or detect, for example, an internal operating state (e.g., power or temperature) of the electronic device 1201 or an external environment state (e.g., an altitude, a humidity, or brightness) to generate an electrical signal or a data value corresponding to the information of the measured state or the detected state. The sensor module 1276 may include, for example, at least one of a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared sensor, a biometric sensor (e.g., an iris sensor, a fingerprint sensor, a heartbeat rate monitoring (HRM) sensor, an e-nose sensor, an electromyography (EMG) sensor, an electroencephalogram (EEG) sensor, an electrocardiogram (ECG) sensor), a temperature sensor, a humidity sensor, an illuminance sensor, or an UV sensor. The sensor module 1276 may further include a control circuit for controlling at least one or more sensors included therein. According to an embodiment, the electronic device 1201 may control the sensor module 1276 by using the processor 1220 or a processor (e.g., a sensor hub) separate from the processor 1220. In the case that the separate processor (e.g., a sensor hub) is used, while the processor 1220 is in a sleep state, the separate processor may operate without awakening the processor 1220 to control at least a portion of the operation or the state of the sensor module 1276.

According to an embodiment, the interface 1277 may include a high definition multimedia interface (HDMI), a USB, an optical interface, a recommended standard 232 (RS-232), a D-subminiature (D-sub), a mobile high-definition link (MHL) interface, a SD card/MMC (multi-media card) interface, or an audio interface. A connector 1278 may physically connect the electronic device 1201 and the electronic device 1206. According to an embodiment, the connector 1278 may include, for example, an USB connector, an SD card/MMC connector, or an audio connector (e.g., a headphone connector).

The haptic module 1279 may convert an electrical signal into mechanical stimulation (e.g., vibration or motion) or into electrical stimulation. For example, the haptic module 1279 may apply tactile or kinesthetic stimulation to a user. The haptic module 1279 may include, for example, a motor, a piezoelectric element, or an electric stimulator.

The camera module 1280 may capture, for example, a still image and a moving picture. According to an embodiment, the camera module 1280 may include at least one lens (e.g., a wide-angle lens and a telephoto lens, or a front lens and a rear lens), an image sensor, an image signal processor, or a flash (e.g., a light emitting diode or a xenon lamp).

The power management module 1288, which is to manage the power of the electronic device 1201, may constitute at least a portion of a power management integrated circuit (PMIC).

The battery 1289 may include a primary cell, a secondary cell, or a fuel cell and may be recharged by an external power source to supply power at least one component of the electronic device 1201.

The communication module 1290 may establish a communication channel between the electronic device 1201 and an external device (e.g., the first external electronic device 1202, the second external electronic device 1204, or the server 1208). The communication module 1290 may support wired communication or wireless communication through the established communication channel. According to an embodiment, the communication module 1290 may include a wireless communication module 1292 or a wired communication module 1294. The communication module 1290 may communicate with the external device through a first network 1298 (e.g. a wireless local area network such as Bluetooth or infrared data association (IrDA)) or a second network 1299 (e.g., a wireless wide area network such as a cellular network) through a relevant module among the wireless communication module 1292 or the wired communication module 1294.

The wireless communication module 1292 may support, for example, cellular communication, local wireless communication, global navigation satellite system (GNSS) communication. The cellular communication may include, for example, long-term evolution (LTE), LTE Advance (LTE-A), code division multiple access (CDMA), wideband CDMA (WCDMA), universal mobile telecommunications system (UMTS), Wireless Broadband (WiBro), or Global System for Mobile Communications (GSM). The local wireless communication may include wireless fidelity (Wi-Fi), Wi-Fi Direct, light fidelity (Li-Fi), Bluetooth, Bluetooth low energy (BLE), Zigbee, near field communication (NFC), magnetic secure transmission (MST), radio frequency (RF), or a body area network (BAN). The GNSS may include at least one of a global positioning system (GPS), a Global Navigation Satellite System (Glonass), Beidou Navigation Satellite System (Beidou), the European global satellite-based navigation system (Galileo), or the like. In the disclosure, "GPS" and "GNSS" may be interchangeably used.

According to an embodiment, when the wireless communication module 1292 supports cellar communication, the wireless communication module 1292 may, for example, identify or authenticate the electronic device 1201 within a communication network using the subscriber identification module (e.g., a SIM card) 1296. According to an embodiment, the wireless communication module 1292 may include a CP separate from the processor 1220 (e.g., AP). In this case, the communication processor may perform at least a portion of functions associated with at least one of components 1210 to 1296 of the electronic device 1201 in substitute for the processor 1220 when the processor 1220 is in an inactive (sleep) state, and together with the processor 1220 when the processor 1220 is in an active state. According to an embodiment, the wireless communication module 1292 may include a plurality of communication modules, each supporting only a relevant communication scheme among cellular communication, local wireless communication, or a GNSS communication.

The wired communication module 1294 may include, for example, a local area network (LAN) service, a power line communication, or a plain old telephone service (POTS).

For example, the first network 1298 may employ, for example, Wi-Fi direct or Bluetooth for transmitting or receiving commands or data through wireless direct connection between the electronic device 1201 and the first external electronic device 1202. The second network 1299 may include a telecommunication network (e.g., a computer network such as a LAN or a WAN, the Internet or a telephone network) for transmitting or receiving commands or data between the electronic device 1201 and the second electronic device 1204.

According to various embodiments, the commands or the data may be transmitted or received between the electronic device 1201 and the second external electronic device 1204 through the server 1208 connected with the second network 1299. Each of the first and second external electronic devices 1202 and 1204 may be a device of which the type is different from or the same as that of the electronic device 1201. According to various embodiments, all or a part of operations that the electronic device 1201 will perform may be executed by another or a plurality of electronic devices (e.g., the electronic devices 1202 and 1204 or the server 1208). According to an embodiment, in the case that the electronic device 1201 executes any function or service automatically or in response to a request, the electronic device 1201 may not perform the function or the service internally, but may alternatively or additionally transmit requests for at least a part of a function associated with the electronic device 1201 to any other device (e.g., the electronic device 1202 or 1204 or the server 1208). The other electronic device (e.g., the electronic device 1202 or 1204 or the server 1208) may execute the requested function or additional function and may transmit the execution result to the electronic device 1201. The electronic device 1201 may provide the requested function or service using the received result or may additionally process the received result to provide the requested function or service. To this end, for example, cloud computing, distributed computing, or client-server computing may be used.

Figure 13:
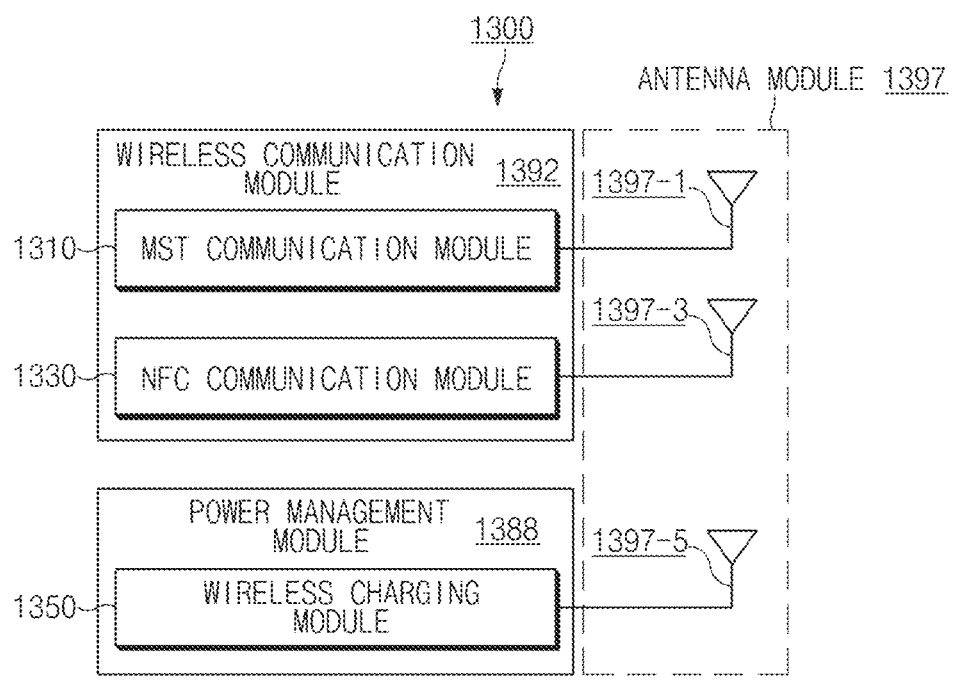
FIG. 13 is a block diagram illustrating a wireless communication module, a power management module, and an antenna module of an electronic device according to an embodiment of the disclosure.

FIG. 13 is a block diagram 1300 illustrating the wireless communication module 1292, the power management module 1288, and the antenna module 1297 of an electronic device 1201 according to an embodiment of the disclosure.

Referring to FIG. 13, the wireless communication module 1292 may include an MST communication module 1310 or an NFC communication module 1330, and the power management module 1288 may include a wireless charging module 1350. In this case, the antenna module 1397 may separately include a plurality of antennas which includes an MST antenna 1397-1 connected with the MST communication module 1310, an NFC antenna 1397-3 connected with the NFC communication module 1330, and a wireless charging antenna 1397-5 connected with the wireless charging module 1350. To avoid redundancy, additional description associated with components which are the same as the components of FIG. 12 will be omitted or will be briefly described.

The MST communication module 1310 may receive a signal (e.g., a signal including control information or payment information) from the processor 1220, may generate a magnetic signal corresponding to the received signal through the MST antenna 1397-1, and may transmit the generated magnetic signal to the external electronic device 1202 (e.g., a POS device). According to an embodiment, for example, the MST communication module 1310 may include a switching module (not illustrated) including one or more switches connected with the MST antenna 1397-1, and may control the switching module to change a direction of a voltage or a current to be supplied to the MST antenna 1397-1. The change of the direction of the voltage or current allows the direction of the magnetic signal (e.g., a magnetic field) emitted from the MST antenna 1397-1 to change accordingly. The magnetic signal transmitted with the direction changed may cause a form and an effect which are similar to those of a magnetic field generated while (or when) a magnetic card is swiped by a card reader of the electronic device 1202. According to an embodiment, payment-related information and a control signal received from the electronic device 1202 in the form of the magnetic signal may be transmitted, for example, to a server (e.g., the server 1208) through the network 1299.

The NFC communication module 1330 may obtain a signal (e.g., control information or payment information) from the processor 1220, and may transmit the obtained signal to the external electronic device 1202 through the NFC antenna 1397-3. According to an embodiment, the NFC communication module 1330 may receive a signal (e.g., a signal including control information or payment information) transmitted from the external electronic device 1202 through the NFC antenna 1397-3.

The wireless charging module 1350 may wirelessly transmit a power to the external electronic device 1202 (e.g., a mobile phone or a wearable device) through the wireless charging antenna 1397-5, or may wirelessly receive a power from the external electronic device 1202 (e.g., a wireless charging device). The wireless charging module 1350 may support various wireless charging manners, for example, including a magnetic resonance manner or a magnetic induction manner.

According to an embodiment, some of the MST antenna 1397-1, the NFC antenna 1397-3, or the wireless charging antenna 1397-5 may mutually share at least a portion of a radiation unit (or radiator). For example, a radiation part of the MST antenna 1397-1 may be used as a radiation part of the NFC antenna 1397-3 or the wireless charging antenna 1397-5, and vice versa. In the case where the MST antenna 1397-1, the NFC antenna 1397-3, or the wireless charging antenna 1397-5 shares at least a partial region of a radiation part, the antenna module 1397 may include a switching circuit (not illustrated) for selectively connecting or separating (e.g., opening) at least a part of the antennas 1397-1, 1397-3, and 1397-5 under control of the wireless communication module 1292 (e.g., the MST communication module 1310 or the NFC communication module 1330) or a power management module 1388 (e.g., the wireless charging module 1350). For example, in the case where the electronic device 1201 uses a wireless charging function, the NFC communication module 1330 or the wireless charging module 1350 may control the switching circuit such that the at least a partial region of the radiation part shared by the NFC antenna 1397-3 and the wireless charging antenna 1397-5 is temporarily separated from the NFC antenna 1397-3 and is connected only with the wireless charging antenna 1397-5.

According to an embodiment, at least a part of functions of the MST communication module 1310, the NFC communication module 1330, or the wireless charging module 1350 may be controlled by an external processor (e.g., the processor 1220). According to an embodiment, specified functions (e.g., a payment function) of the MST communication module 1310 or the NFC communication module 1330 may be performed in a trusted execution environment (TEE). The TEE according to various embodiments may be, for example, an execution environment in which at least a portion of a specified region of the memory 1230 is assigned to perform a function (e.g., a financial transaction or a private information related function) needing a relatively high level of security and an access to the specified region is separately and restrictively allowed, for example, depending on an access subject or an application to be executed.

Various embodiments of the disclosure and terms used herein are not intended to limit the technologies described in the disclosure to specific embodiments, and it should be understood that the embodiments and the terms include modification, equivalent, and/or alternative on the corresponding embodiments described herein. With regard to description of drawings, similar components may be marked by similar reference numerals. The terms of a singular form may include plural forms unless otherwise specified. In the disclosure disclosed herein, the expressions "A or B", "at least one of A and/or B", "A, B, or C", or "at least one of A, B, and/or C", and the like used herein may include any and all combinations of one or more of the associated listed items. Expressions such as "first," or "second," and the like, may express their components regardless of their priority or importance and may be used to distinguish one component from another component but is not limited to these components. When an (e.g., first) component is referred to as being "(operatively or communicatively) coupled with/to" or "connected to" another (e.g., second) component, it may be directly coupled with/to or connected to the other component or an intervening component (e.g., a third component) may be.

According to the situation, the expression "adapted to or configured to" used herein may be interchangeably used as, for example, the expression "suitable for", "having the capacity to", "changed to", "made to", "capable of" or "designed to" in hardware or software. The expression "a device configured to" may mean that the device is "capable of" operating together with another device or other parts. For example, a "processor configured to (or set to) perform A, B, and C" may mean a dedicated processor (e.g., an embedded processor) for performing corresponding operations or a generic-purpose processor (e.g., a central processing unit (CPU) or an AP) which performs corresponding operations by executing one or more software programs which are stored in a memory device (e.g., the memory 1230).

The term "module" used herein may include a unit, which is implemented with hardware, software, or firmware, and may be interchangeably used with the terms "logic", "logical block", "part", "circuit", or the like. The "module" may be a minimum unit of an integrated part or a part thereof or may be a minimum unit for performing one or more functions or a part thereof. The "module" may be implemented mechanically or electronically and may include, for example, an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media (e.g., the memory 1230) in the form of a program module. The instruction, when executed by a processor (e.g., the processor 1220), may cause the processor to perform a function corresponding to the instruction. The computer-readable recording medium may include a hard disk, a floppy disk, a magnetic media (e.g., a magnetic tape), an optical media (e.g., a compact disc read only memory (CD-ROM) and a DVD, a magneto-optical media (e.g., a floptical disk)), an embedded memory, and the like. The one or more instructions may contain a code made by a compiler or a code executable by an interpreter.

Each component (e.g., a module or a program module) according to various embodiments may be composed of single entity or a plurality of entities, a part of the above-described sub-components may be omitted, or other sub-components may be further included. Alternatively or additionally, after being integrated in one entity, some components (e.g., a module or a program module) may identically or similarly perform the function executed by each corresponding component before integration. According to various embodiments, operations executed by modules, program modules, or other components may be executed by a successive method, a parallel method, a repeated method, or a heuristic method, or at least one part of operations may be executed in different sequences or omitted. Alternatively, other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a housing including a first surface, a second surface facing away from the first surface, and a side member surrounding a space between the first surface and the second surface;
   a display exposed through the first surface of the housing;
   a first radiator forming a portion of the side member;
   a printed circuit board (PCB) positioned within the housing and including a ground layer;
   a communication circuit positioned on the PCB; and
   a conductive pattern having a length corresponding to a length of the first radiator,
   wherein a first portion including one end of the conductive pattern is positioned adjacent to the first radiator,
   wherein the other end of the conductive pattern is connected with the ground layer of the PCB to guide a current in the ground layer, so that a path of a current formed at the first radiator and a path of a current formed at the ground layer are formed symmetrically to each other, and
   wherein a rest portion of the conductive pattern except for the first portion is positioned to overlap with the ground layer, when viewed from above the first surface.

2. The electronic device of claim 1, wherein the first portion of the conductive pattern is interposed between the first radiator and the ground layer.

3. The electronic device of claim 1, wherein the first portion of the conductive pattern is spaced from the first radiator by a specified length.

4. The electronic device of claim 1, wherein the rest portion of the conductive pattern is positioned above a region to which a current generated in the ground layer by a current applied to the first radiator by the communication circuit flows.

5. The electronic device of claim 4, wherein the rest portion of the conductive pattern is formed above an electrical path of a current generated in the ground layer.

6. The electronic device of claim 4, wherein the conductive pattern includes at least one bending part.

7. The electronic device of claim 4, wherein at least a portion of the rest portion of the conductive pattern is formed symmetrical to the first radiator with respect to the first portion.

8. The electronic device of claim 1, wherein a length of the rest portion of the conductive pattern except for the first portion is at least 80% of the whole length of the conductive pattern.

9. The electronic device of claim 1,
   wherein the first portion of the conductive pattern is positioned at a specified portion of the first radiator, and
   wherein the specified portion is a portion having a highest voltage when the communication circuit receives a signal in a specified frequency band through the first radiator.

10. The electronic device of claim 9, wherein the specified portion is a segment portion of the first radiator.

11. The electronic device of claim 9, wherein the specified portion is a central portion of the first radiator.

12. The electronic device of claim 1, further comprising:
a second support member coupled on the second surface of the housing,
wherein the conductive pattern is formed at the second support member.

13. The electronic device of claim 1, wherein the other end of the conductive pattern is electrically connected with the ground layer of the PCB through a C-clip.

14. The electronic device of claim 1,
wherein a side surface of the housing includes a first edge formed with a first length, a second edge formed parallel to the first edge with the first length, a third edge formed with a second length, and a fourth edge formed parallel to the third edge with the second length,
wherein the second support member further includes a second radiator forming a portion of the side surface,
wherein the first radiator is included in the first edge, and
wherein the second radiator is included in the second edge.

15. The electronic device of claim 14,
wherein the first radiator receives a signal in a first frequency band through a first electrical path formed by a current applied by the communication circuit, and
wherein the second radiator receives a signal in a second frequency band through a second electrical path formed by a current applied by the communication circuit.

16. The electronic device of claim 1, wherein the first portion including the one end of the conductive pattern is positioned at a segment portion of the first radiator.

* * * * *